(12) United States Patent
Hsu

(10) Patent No.: US 10,021,795 B2
(45) Date of Patent: Jul. 10, 2018

(54) SUPPORTING DEVICE AND DISPLAY APPARATUS

(71) Applicant: FIRST DOME CORPORATION, New Taipei (TW)

(72) Inventor: An-Szu Hsu, New Taipei (TW)

(73) Assignee: FIRST DOME CORPORATION, New Taipei (TW)

( * ) Notice: Subject to any disclaimer, the term of this patent is extended or adjusted under 35 U.S.C. 154(b) by 0 days.

(21) Appl. No.: 15/403,993

(22) Filed: Jan. 11, 2017

(65) Prior Publication Data

US 2018/0092223 A1  Mar. 29, 2018

(30) Foreign Application Priority Data

Sep. 23, 2016 (TW) .............................. 105214639 U

(51) Int. Cl.
*H05K 5/00* (2006.01)
*H05K 5/02* (2006.01)

(52) U.S. Cl.
CPC ......... *H05K 5/0017* (2013.01); *H05K 5/0226* (2013.01)

(58) Field of Classification Search
None
See application file for complete search history.

(56) References Cited

U.S. PATENT DOCUMENTS

| 6,520,605 | B2 * | 2/2003 | Nunokawa | H05K 5/0204 |
| | | | | 312/111 |
| 9,665,127 | B2 * | 5/2017 | Solland | G06F 1/1654 |
| 9,869,114 | B1 * | 1/2018 | Hung | E05D 3/18 |
| 2014/0196254 | A1 * | 7/2014 | Song | E05D 3/14 |
| | | | | 16/302 |

* cited by examiner

*Primary Examiner* — Courtney Smith
*Assistant Examiner* — Rashen E Morrison
(74) *Attorney, Agent, or Firm* — Li & Cai Intellectual Property (USA) Office

(57) ABSTRACT

A supporting device includes a modular joint assembly, two fixing members respectively installed on two opposite ends of the modular joint assembly, and a resilient sheet fixed on the outer surface of the modular joint assembly and the fixing members. The modular joint assembly includes a plurality of joints buckled in sequence. Each joint has an arced track groove recessed on a side surface thereof and a buckling portion extended from an opposite side surface thereof. An imaginary datum line is defined by connecting a center of circle of each track groove and is located at one side of the resilient sheet away from the modular joint assembly. When any two buckled joints are rotated with respect to each other, the resilient sheet is compressed and a length of the imaginary datum line is unchanged.

15 Claims, 12 Drawing Sheets

SUPPORTING DEVICE AND DISPLAY APPARATUS

BACKGROUND OF THE INVENTION

Field of the Invention

The instant invention relates to a supporting device and a display apparatus; in particular, to a supporting device and a display apparatus each having a modular joint assembly.

Description of Related Art

When a conventional multi-axis supporting device is applied to a bendable display, the rotating axes of the conventional multi-axis supporting device are located at the inner side or the outer side of the bendable display, and the rotating axes are located apart from the bendable display at a distance. If the bendable display is bent along the rotating axes, the conventional multi-axis supporting device is prone to stretch or compress the bendable display, causing the bendable display to break.

SUMMARY OF THE INVENTION

The instant disclosure provides a supporting device and a display apparatus for effectively solving the problem caused by conventional multi-axis supporting devices.

The instant disclosure provides a display apparatus that includes a supporting device and a bendable display. The supporting device includes a modular joint assembly, two fixing members respectively installed on two of the joints arranged at two opposite ends of the modular joint assembly, and a resilient sheet fixed on the joints and the two fixing members. The modular joint assembly has a plurality of joints buckled in sequence, and each of the joints includes a main portion and a buckling portion. Specifically, each main portion has a first mating surface, an opposite second mating surface, an inner surface connected to an edge of the first mating surface and an edge of the second mating surface, and an outer surface connected to another edge of the first mating surface and another edge of the second mating surface. For each of the main portions, a distance between the first mating surface and the second mating surface gradually increases in a direction from the inner surface to the outer surface, the main portion has an arced track groove recessed in the first mating surface, and a center of circle of the track groove is located at one side of the outer surface away from the second mating surface. The buckling portion of each joint is extended from the second mating surface. In any two buckled joints, the buckling portion of one of the any two buckled joints is arranged in the track groove of the other joint, and the any two buckled joints are rotatable relative to each other between a first position and a second position. Moreover, an imaginary datum line is defined by connecting the centers of the track grooves, the imaginary datum line being located at one side of the resilient sheet away from the modular joint assembly. When the any two buckled joints are rotated with respect to each other, the resilient sheet is compressed and a length of the imaginary datum line is unchanged. The bendable display is mounted on the resilient sheet and arranged at the imaginary datum line, and the bendable display and the imaginary datum line are configured to bend synchronously.

The instant disclosure also provides a supporting device including a modular joint assembly, two fixing members respectively installed on two of the joints arranged at two opposite ends of the modular joint assembly, and a resilient sheet fixed on the joints and the two fixing members. The modular joint assembly has a plurality of joints buckled in sequence, and each of the joints includes a main portion and a buckling portion. Specifically, each main portion has a first mating surface, an opposite second mating surface, an inner surface connected to an edge of the first mating surface and an edge of the second mating surface, and an outer surface connected to another edge of the first mating surface and another edge of the second mating surface. For each of the main portions, a distance between the first mating surface and the second mating surface gradually increases in a direction from the inner surface to the outer surface, the main portion has an arced track groove recessed on the first mating surface, and a center of circle of the track groove is located at one side of the outer surface away from the second mating surface. The buckling portion of each joint is extended from the second mating surface. In any two buckled joints, the buckling portion of one of the any two buckled joints is arranged in the track groove of the other joint, and the any two buckled joints are rotatable relative to each other between a first position and a second position. Moreover, an imaginary datum line is defined by connecting the centers of the track grooves, the imaginary datum line being located at one side of the resilient sheet away from the modular joint assembly. When the any two buckled joints are rotated with respect to each other, the resilient sheet is compressed and a length of the imaginary datum line is unchanged.

In summary, the bendable display of the instant disclosure is arranged at the imaginary datum line (i.e., all rotating axes of the modular joint assembly are located at the imaginary datum line), and the bendable display is configured to rotate along the rotating axes, so that the supporting device does not stretch or compress the bendable display, thereby reducing the breaking probability of the bendable display.

In order to further appreciate the characteristics and technical contents of the instant invention, references are hereunder made to the detailed descriptions and appended drawings in connection with the instant invention. However, the appended drawings are merely shown for exemplary purposes, and should not be construed as restricting the scope of the instant invention.

DETAILED DESCRIPTION OF THE PREFERRED EMBODIMENTS

Please refer to FIGS. 1 through 12, which show an embodiment of the instant disclosure. References are hereunder made to the detailed descriptions and appended drawings in connection with the instant invention. However, the appended drawings are merely provided for exemplary purposes, and should not be construed as restricting the scope of the instant invention.

Figure 1:
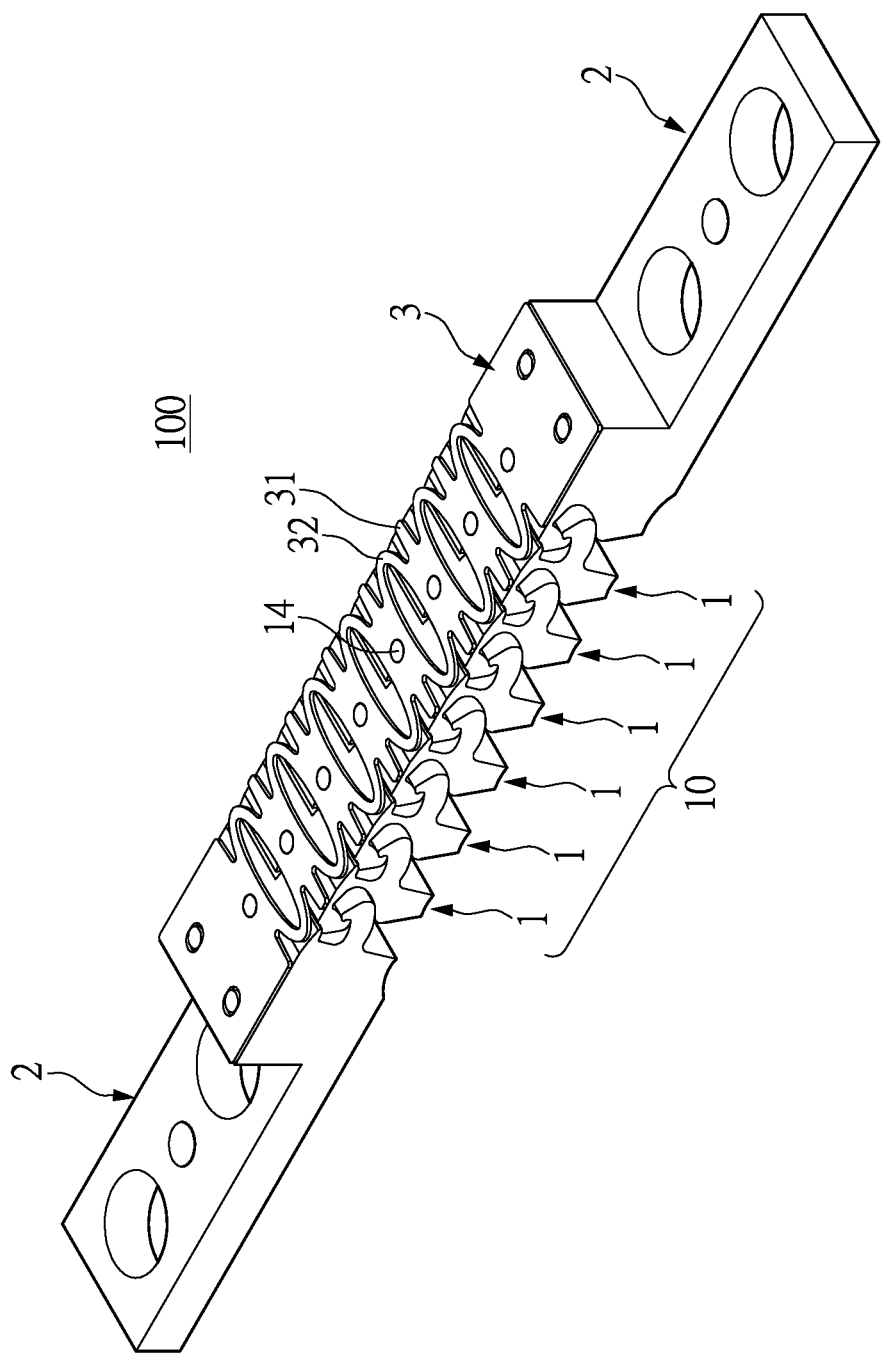
FIG. 1 is a perspective view showing a supporting device according to the instant disclosure.
Figure 2:
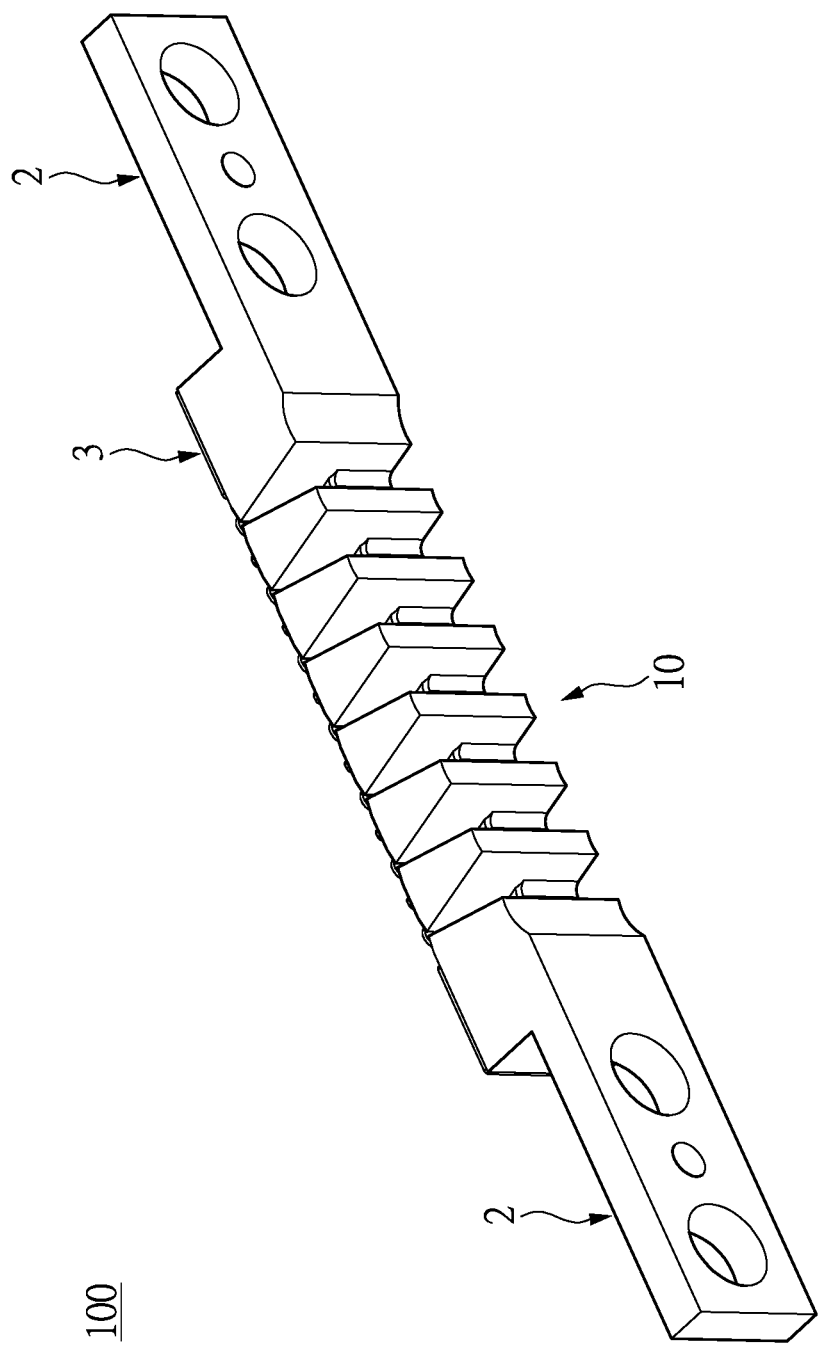
FIG. 2 is a perspective view showing the supporting device according to the instant disclosure from another perspective.
Figure 3:
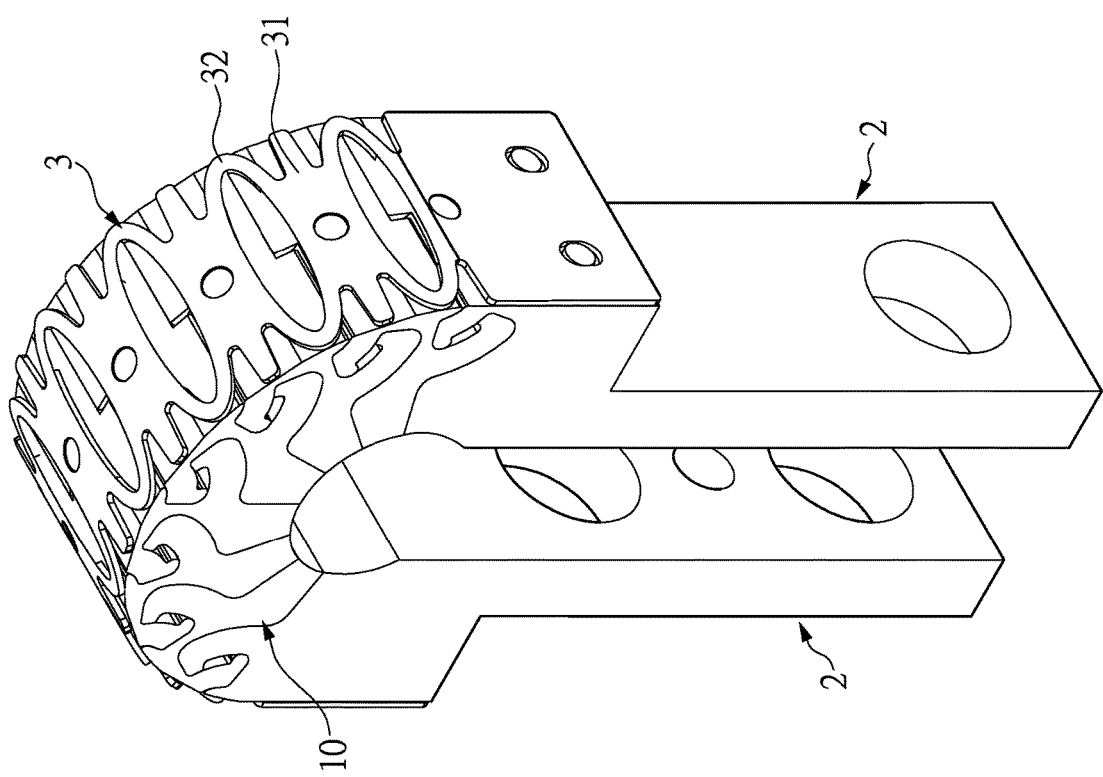
FIG. 3 is a perspective view showing the supporting device in a bending mode.

As shown in FIGS. 1 through 3, the instant embodiment discloses, but is not limited to, a (multi-axis) supporting device 100 for mounting a bendable display that allows the supporting device 100 and the bendable display to be bent synchronously. The supporting device 100 includes an elongated modular joint assembly 10, two fixing members 2 installed on two opposite ends of the modular joint assembly 10, and a resilient sheet 3 mounted on the modular joint assembly 10 and the two fixing members 2.

Since the components of the supporting device 100 move in relative motion, the figures depict only the fixed parts of the components in order to more clearly explain the instant embodiment. The following description discloses the structure and connection relationships of each component of the supporting device 100.

Figure 4:
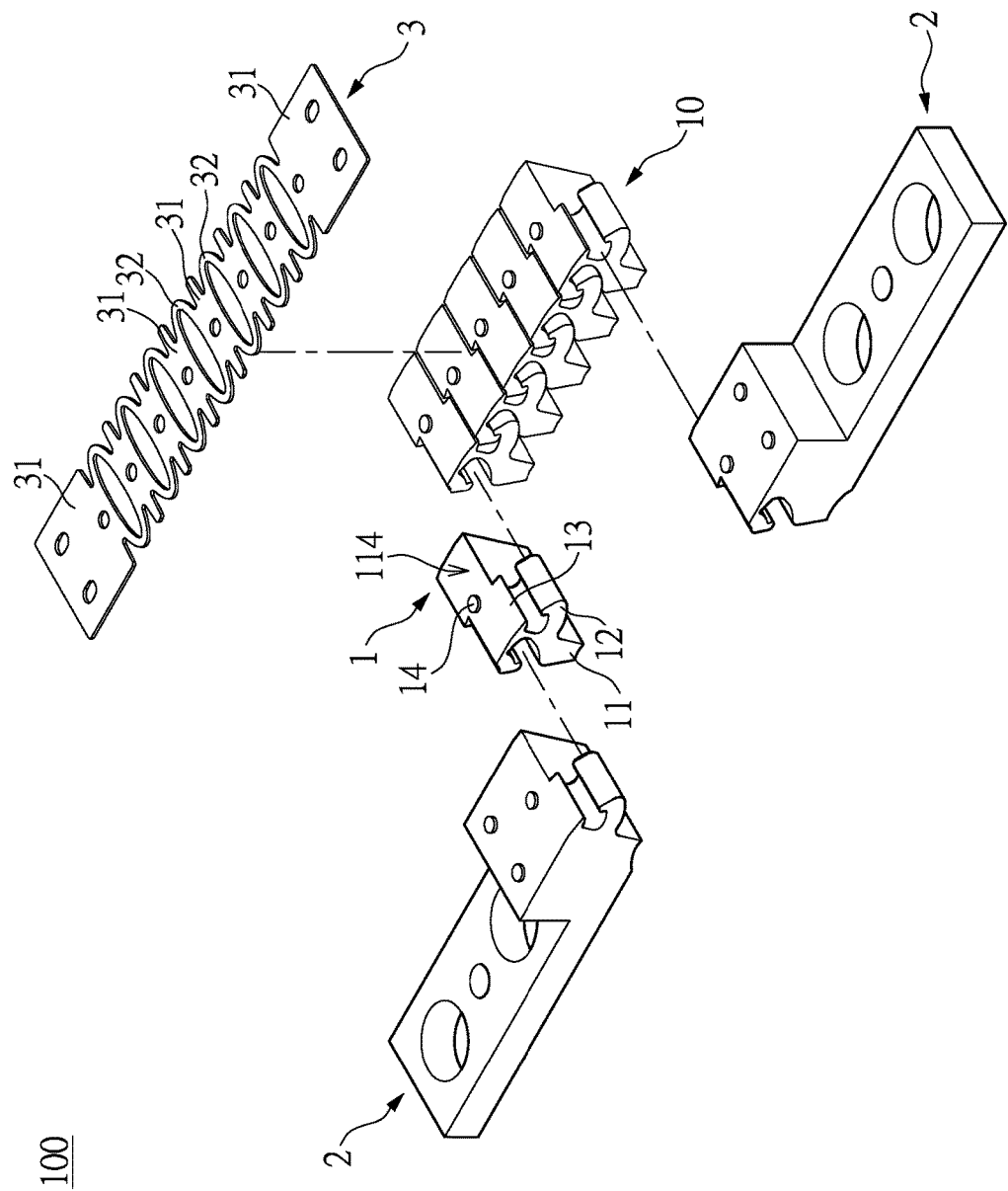
FIG. 4 is an exploded view of FIG. 1.
Figure 5:
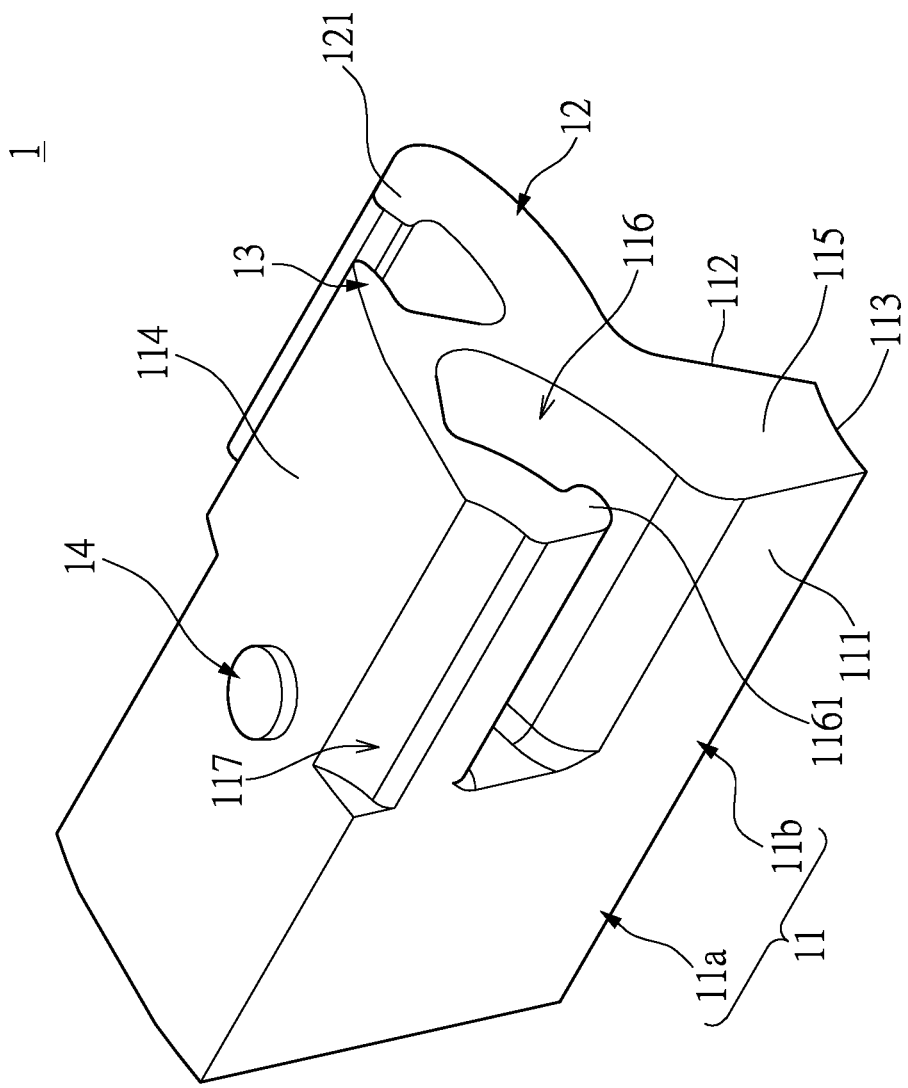
FIG. 5 is a perspective view showing a joint according to the instant disclosure.
Figure 6:
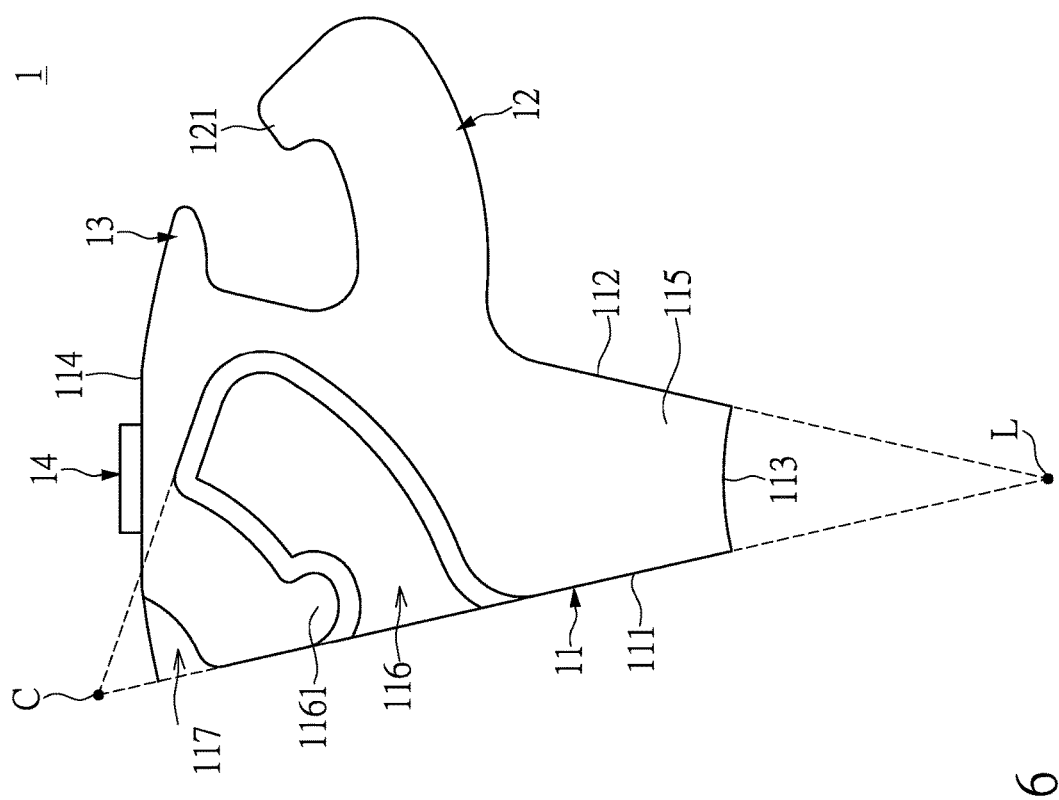
FIG. 6 is a side view of FIG. 5.

As shown in FIGS. 4 through 6, the modular joint assembly 10 includes a plurality of joints 1 (detachably) buckled in sequence. As the joints 1 in the instant embodiment are of the same structure, the following description discloses the structure of just one of the joints 1 for the sake of brevity. However, in other embodiments of the instant invention, the joints 1 may be formed of difference structures.

As shown in FIGS. 5 and 6, the joint 1 is an integral structure and includes a main portion 11, a buckling portion 12, a guiding protrusion 13, and a positioning portion 14. The main portion 11 is an approximately trapezoid column and includes a first mating surface 111 (i.e., the left surface of the main portion 11 shown in FIG. 6), an opposite second mating surface 112 (i.e., the right surface of the main portion 11 shown in FIG. 6), an inner surface 113 (i.e., the bottom surface of the main portion 11 shown in FIG. 6) connected to an edge of the first mating surface 111 and an edge of the second mating surface 112, and an outer surface 114 (i.e., the top surface of the main portion 11 shown in FIG. 6) connected to another edge of the first mating surface 111 and another edge of the second mating surface 112.

Moreover, a distance between the first mating surface 111 and the second mating surface 112 gradually increases in a direction from the inner surface 113 to the outer surface 114 (i.e., from bottom to top, as shown in FIG. 6). The first mating surface 111 and the second mating surface 112 in the instant embodiment are planar surfaces and extend virtually to form an intersection line L.

Specifically, the main portion 11 has a stopping block 11a and an actuation block 11b. In this embodiment, most of the features of the joints 1 are formed on the actuation block 11b, but the instant disclosure is not limited thereto. The main portion 11 (or the actuation block 11b) has an arced track groove 116 recessed in the first mating surface 111, and a center of circle C of the track groove 16 is located at one side of the outer surface 114 away from the second mating surface 112 (i.e., the left-upper side of the outer surface 114 shown in FIG. 6). The track groove 116 is also exposed from an end surface 115 of the actuation block 11b arranged away from the stopping block 11a (as shown in FIG. 5). That is to say, a bottom of the track groove 116 is arranged on the stopping block 11a. The main portion 11 (or the actuation block 11b) further has a stopping ridge 1161 arranged in the track groove 116 and adjajcent to the first mating surface 111, thereby reducing an opening of the track groove 116 arranged on the first mating surface 111.

Moreover, the main portion 11 (or the actuation block 11b) has a guiding concavity 117 recessed on a common border between the first mating surface 111 and the outer surface 114. The guiding concavity 117 is preferably formed by an arc surface, and a center of circle of the guiding concavity 117 overlaps the center of circle C of the track groove 116. The guiding concavity 117 is also exposed from the end surface 115 of the actuation block 11b arranged away from the stopping block 11a.

The buckling portion 12 has an arced shape and is extended from the second mating surface 112 (of the actuation block 11b) of the main portion 11, and the buckling portion 12 corresponds in shape with the track groove 116 to move therein. The buckling portion 12 has a hook 121 arranged on a free end thereof, and a width of the free end of the buckling portion 12 is larger than that of the opening of the track groove 116. Moreover, the guiding protrusion 13 is extended from a common border between the second mating surface 112 and the outer surface 114. A surface of the guiding protrusion 13 facing the buckling portion 12 (i.e., the bottom surface of the guiding protrusion 13 shown in FIG. 6) is in an arc shape and has a center of circle, which is located at a center of circle of the buckling portion 12. The positioning portion 14 has a pillar-like structure and is formed on a substantial center portion of the outer surface 114 of the main portion 11.

Figure 7:
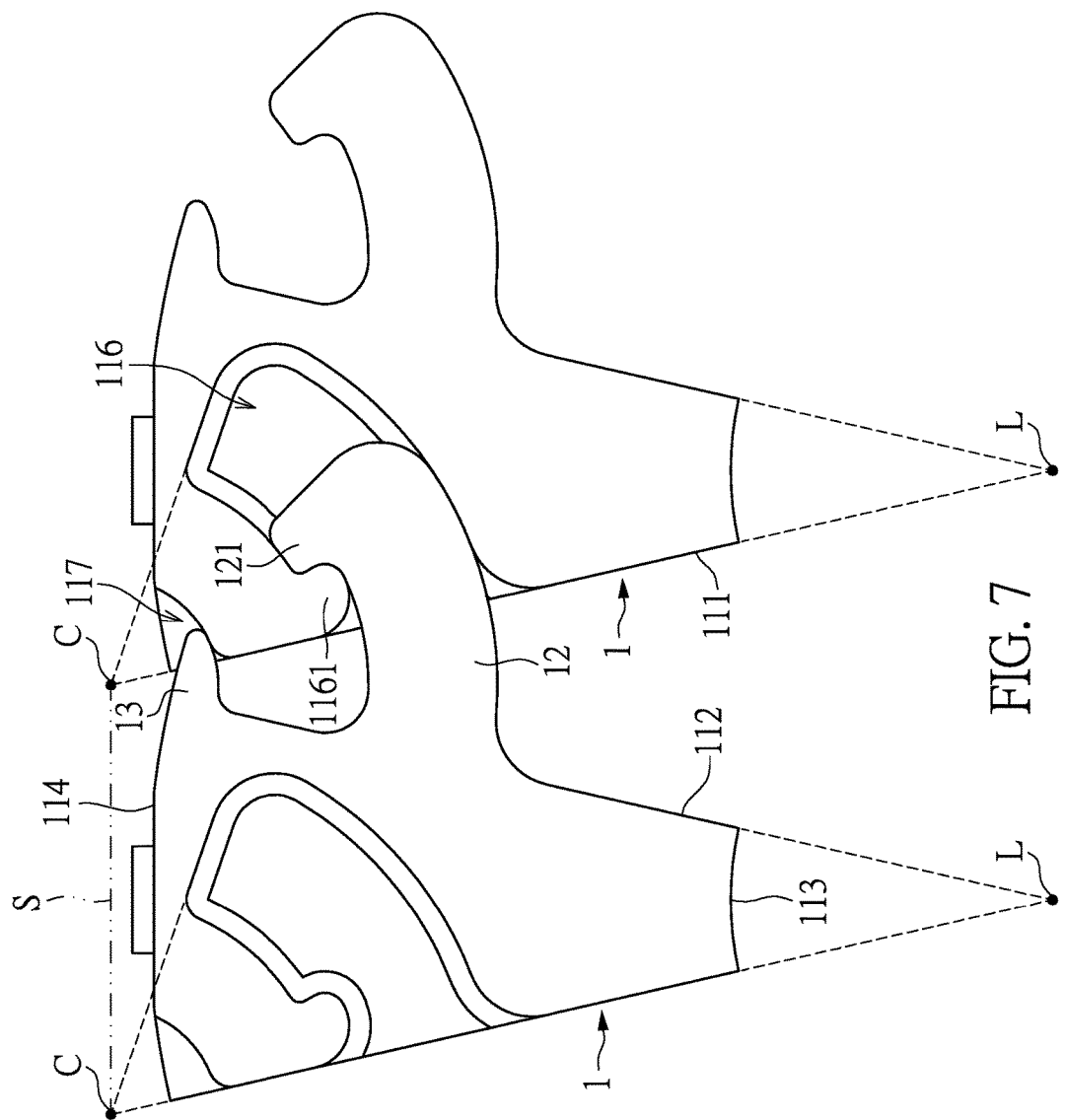
FIG. 7 is a side view showing two bucked joints at a first position.
Figure 8:
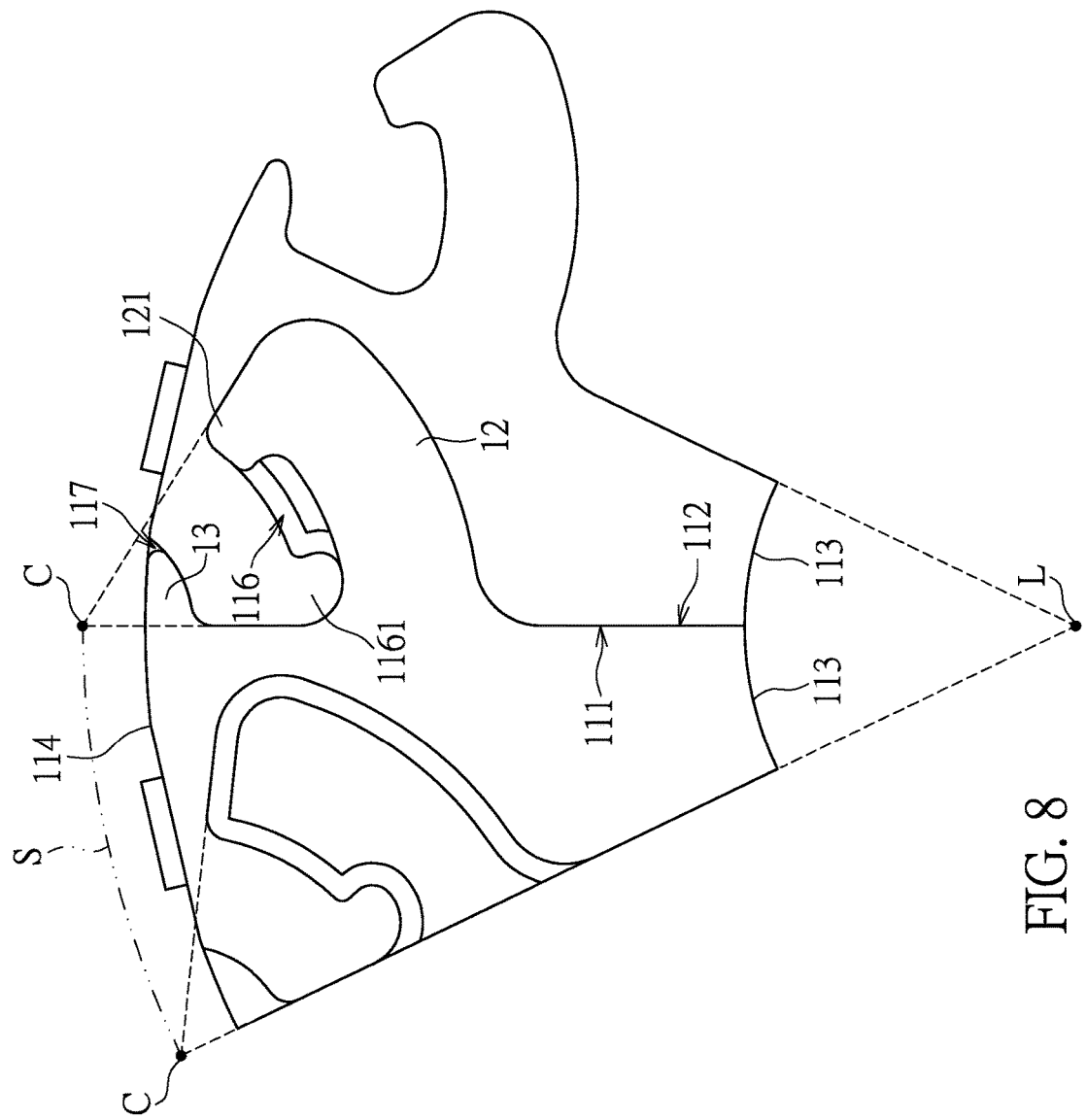
FIG. 8 is a side view showing two bucked joints at a second position.

The structure of the joint 1 has been disclosed in the above description; the following description will disclose the connection relationships of the buckled joints 1. As shown in FIGS. 7 and 8, in any of the two buckled joints 1, the buckling portion 12 and the guiding protrusion 13 of one of any two buckled joints 1 are respectively arranged in the track groove 116 and the guiding concavity 117 of the other joint 1, and the any two buckled joints 1 are rotatable relative to each other between a first position (shown in FIG. 7) and a second position (shown in FIG. 8). The any two buckled joints 1 can be stopped at a desired position between the first position and the second position, but the instant disclosure is not limited thereto.

As shown in FIGS. 7 through 10, in any two buckled joints 1, the center of circle of the buckling portion 12 of one of the any two buckled joints 1 overlaps the center of circle C of the corresponding track groove 116 of the other joint 1, and the any two buckled joints 1 are rotatable along the center of circle C. That is to say, the center of circle C of the track groove 116 can be regarded as a rotating axis. For any two buckled joints 1, an imaginary datum line S can be defined by connecting the centers C of the any two buckled joints 1. In other words, for the modular joint assembly 10, an imaginary datum line S can be defined by connecting the centers C of the modular joint assembly 10. The imaginary datum line S is located at one side of the resilient sheet 3 away from the modular joint assembly 10, and the length of the imaginary datum line S is always unchanged when any two buckled joints 1 are rotated with respect to each other.

In any two buckled joints 1, the guiding protrusion 13 of one of the any two buckled joints 1 is movable and abutted against the guiding concavity 117 of the other joint 1, and the related movement of the any two buckled joints 1 is more smoothly by using the cooperation of the guiding protrusion 13 and the guiding concavity 117.

Specifically, as shown in FIG. 7, when the any two buckled joints 1 are arranged at the first position, the buckling portion 12 is partially arranged in the corresponding track groove 116, the hook 121 is abutted against the stopping ridge 1161, an end portion of the bottom surface of the guiding protrusion 13 contacts the guiding concavity 117, and the intersection lines L of the any two buckled joints 1 are spacedly arranged on a plane. Moreover, the first mating surface 111 and the adjacent second mating surface 112 respectively arranged on the any two buckled joints 1 have an angle, which is substantially equal to an angle defined by the first mating surface 111 and the second mating surface 112 of each of the joints 1.

As shown in FIG. 8, when the any two buckled joints 1 are arranged at the second position, the buckling portion 12 is entirely arranged in the corresponding track groove 116, the hook 121 is arranged away from the stopping ridge 1161, the bottom surface of the guiding protrusion 13 entirely contacts the guiding concavity 117, and the intersection lines L of the any two buckled joints 1 are overlapped with each other. Moreover, the first mating surface 111 of one of the any two buckled joints 1 is stacked on the adjacent second mating surface 112 of the other joint 1.

Figure 9:
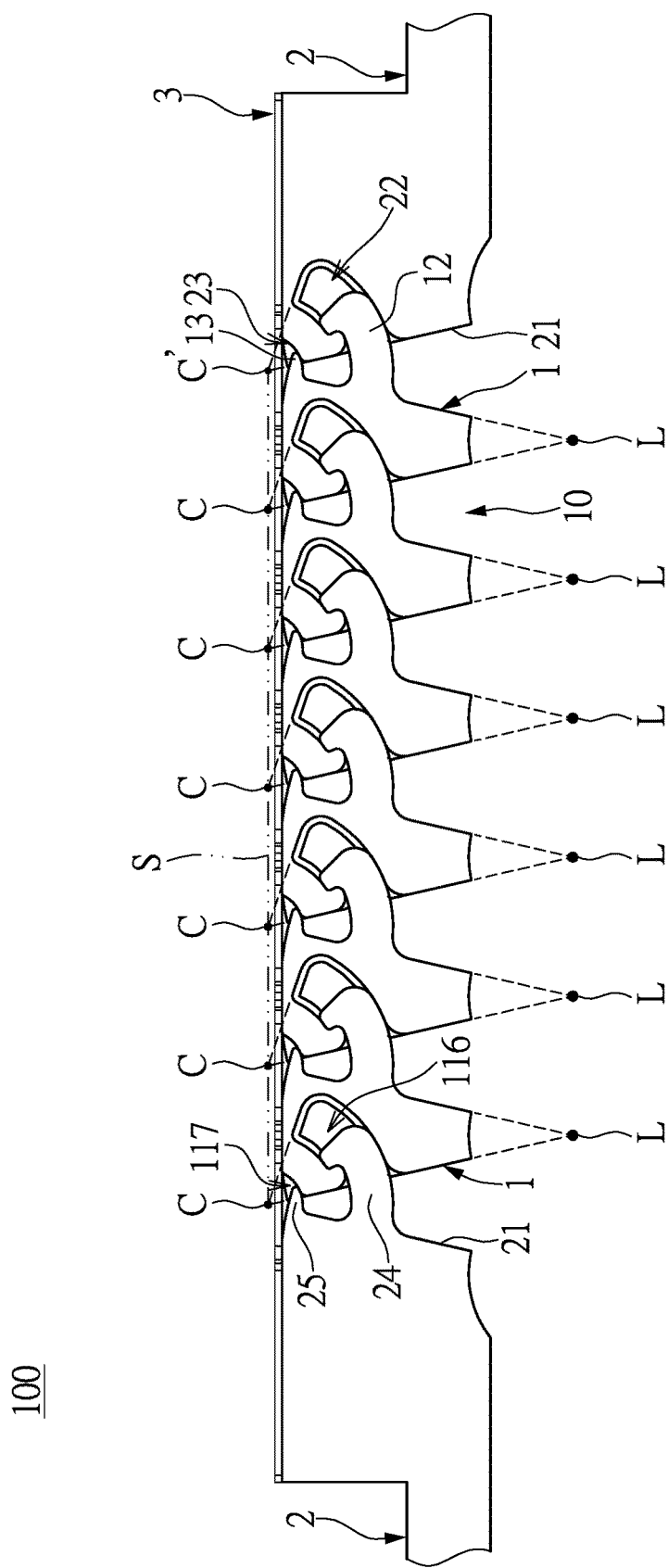
FIG. 9 is a side view of FIG. 1.
Figure 10:
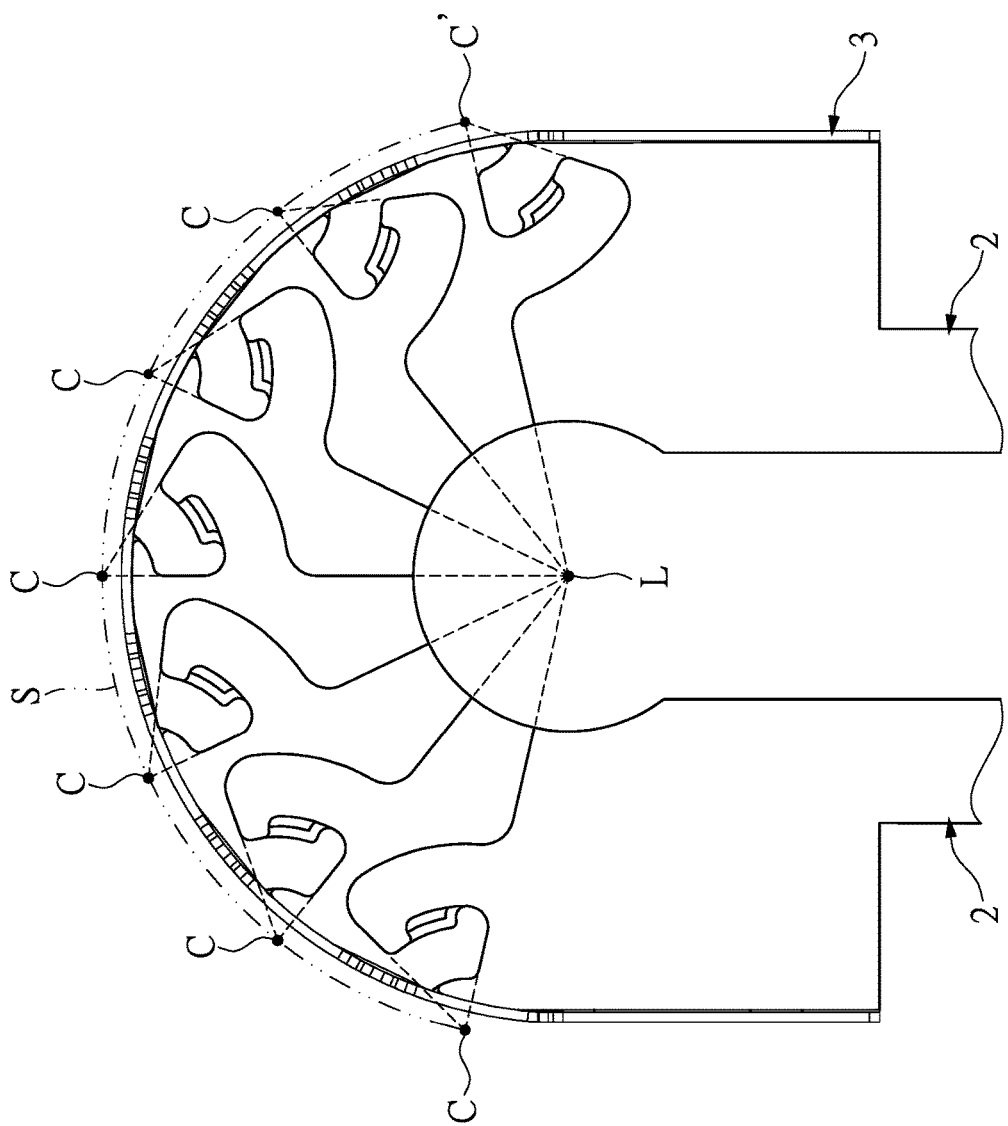
FIG. 10 is a side view of FIG. 3.

In addition, as shown in FIGS. 9 and 10, when any two buckled joints 1 of the modular joint assembly 10 are arranged at the first position, the modular joint assembly 10 forms a straight line, and the intersection lines L of the modular joint assembly 10 are arranged on the same plane. When any two buckled joints 1 of the modular joint assembly 10 are arranged at the second position, the modular joint assembly 10 has an arced structure, and the intersection lines L of the modular joint assembly 10 are overlapped with each other. Moreover, the length of the imaginary datum line S of the modular joint assembly 10 at the second position is equal to that of the imaginary datum line S of the modular joint assembly 10 at the first position.

In other words, the length of the imaginary datum line S of the modular joint assembly 10 is always unchanged when the modular joint assembly 10 is operated from the first position to the second position, so that the space of the inner side of the imaginary datum line S is reduced. Accordingly, the instant embodiment can satisfy the above condition by entirely arranging each guiding protrusion 13 in the corresponding guiding concavity 117 and stacking the first mating surface 111 and the adjacent second mating surface 112, the latter two of which are respectively arranged on two of the buckled joints 1.

In addition, the number of the joints 1 of the modular joint assembly 10 is not limited to the figures and can be adjusted according to designer needs.

The two fixing members 2 are respectively installed on two of the joints 1 arranged on two opposite ends of the modular joint assembly 10 in a movable or unmovable manner. As shown in FIGS. 9 and 10, each fixing member 2 in the instant embodiment includes a third mating surface 21. One of the two fixing member 2 (i.e., the right fixing member 2 shown in FIG. 9) has an arced auxiliary track groove 22 and an arced auxiliary guiding concavity 23 both recessed in the third mating surface 21 thereof, and the other fixing member 2 (i.e., the left fixing member 2 shown in FIG. 9) has an arced auxiliary buckling portion 24 and an arced auxiliary guiding protrusion 25 both extended from the third mating surface 21 thereof.

The auxiliary track groove 22 and the auxiliary guiding concavity 23 are respectively installed to the buckling portion 12 and the guiding protrusion 13 of the joint 1 arranged on one end of the modular joint assembly 10, and the auxiliary buckling portion 24 and the auxiliary guiding protrusion 25 are respectively installed to the track groove 116 and the guiding concavity 117 of the joint 1 arranged on the other end of the modular joint assembly 10, such that each fixing member 2 is configured to rotate with respect to the corresponding joint 1.

Specifically, the auxiliary track groove 22, the auxiliary guiding concavity 23, the auxiliary buckling portion 24, and the auxiliary guiding protrusion 25 in the instant embodiment are respectively identical to the track groove 116, the guiding concavity 117, the buckling portion 12, and the guiding protrusion 13 of each joint 1. The cooperation of each fixing member 2 and the corresponding joint 1 in the instant embodiment is substantially identical to that of any two buckled joints 1. Moreover, the imaginary datum line S of the modular joint assembly 10 can be defined by further connecting the center of circle C' of the auxiliary track groove 22. That is to say, the imaginary datum line S can also be defined by connecting the center of circles C of the modular joint assembly 10 and the center of circle C' of the auxiliary track groove 22, but the instant disclosure is not limited thereto.

As shown in FIGS. 1, 3, and 4, the resilient sheet 3 of this embodiment is made of, but not limited to, rubber, and is fixed on the outer surfaces 114 of the joints 1 and the two fixing members 2. Specifically, the thickness of the resilient sheet 3 is preferably identical to that of the positioning portion 14. The resilient sheet 3 includes a plurality of fixing portions 31 and a plurality of stretchable portions 32, and two opposite ends of each of the stretchable portions 32 are connected to two of the fixing portions 31.

The fixing portions 31 are respectively sleeved at and fastened to the positioning portions 14 of the joints 1 and the positioning portions (not labeled) of the fixing members 2, thereby fixing the resilient sheet 3 on the joints 1 and the fixing members 2. Each of the stretchable portions 32 has an ellipse shape and is arranged above a buckled portion of two buckled joints 1. Moreover, when the any two buckled joints 1 are rotated with respect to each other, the stretchable portions 32 of the resilient sheet 3 is compressed. Thus, the joints 1 and the fixing members 2 are firmly buckled and the relative movement of any two buckled joints 1 (or each of the fixing members 2 and the corresponding joint 1) can be smoothened by virtue of the elastic force generated from the resilient sheet 3.

Figure 11:
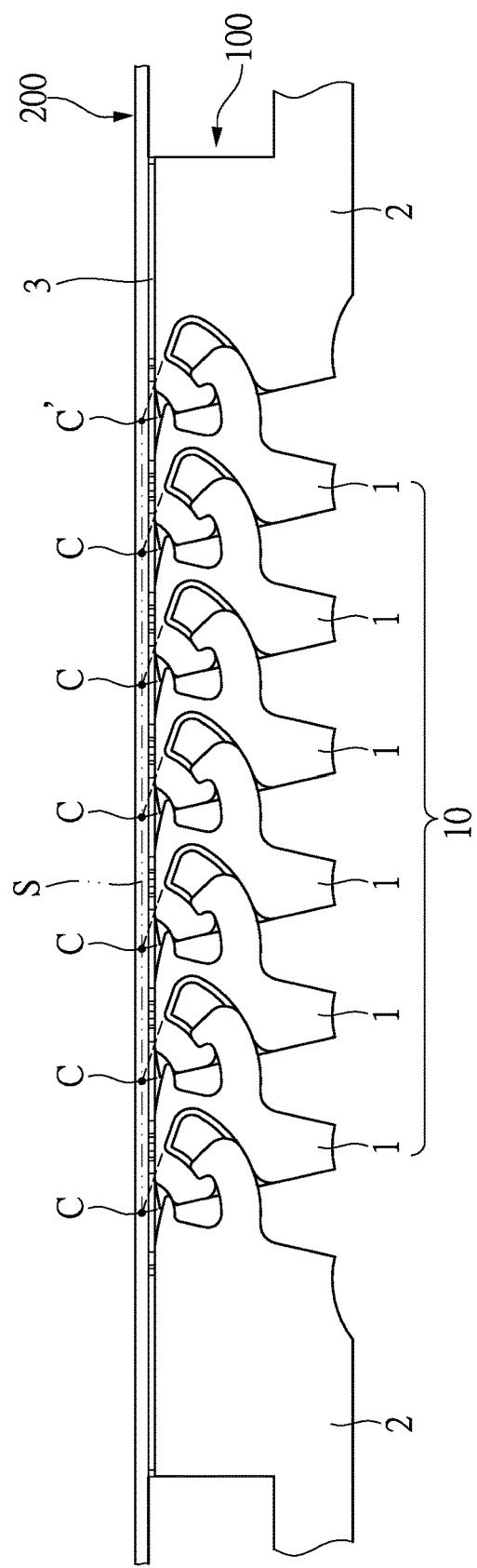
FIG. 11 is a side view showing a display apparatus according to the instant disclosure.
Figure 12:
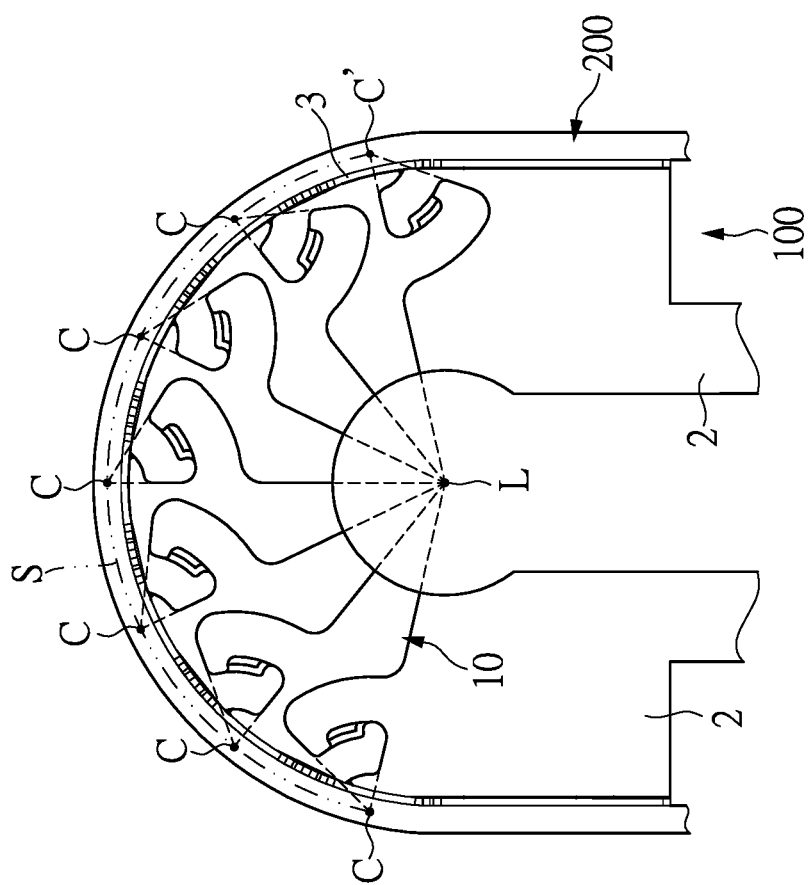
FIG. 12 is a side view showing the display apparatus at a bending mode.

Reference is next made to FIGS. 11 and 12, which show a display apparatus (not labeled) including a supporting device 100 and a bendable display 200. It should be noted that the supporting device 100 of the display apparatus is identical to the above supporting device 100 shown in FIGS. 1 through 10.

The bendable display 200 is mounted on the resilient sheet 3 of the supporting device 100 and is arranged at the imaginary datum line S (i.e., the imaginary datum line S located at the center of the bendable display 200), so that the bendable display 200 and the imaginary datum line S are bent synchronously. In other words, the bendable display 200 is arranged on all of the rotating axes of the modular joint assembly 10, and the bendable display 200 is configured to rotate along the rotating axes. Therefore, the supporting device 100 does not stretch or compress the bendable display 200, thereby reducing a breaking probability of the bendable display 200.

The descriptions illustrated supra set forth simply the preferred embodiments of the instant invention; however, the characteristics of the instant invention are by no means restricted thereto. All changes, alterations, or modifications conveniently considered by those skilled in the art are deemed to be encompassed within the scope of the instant invention delineated by the following claims.

What is claimed is:

1. A display apparatus, comprising:
   a supporting device, including:
      a modular joint assembly having a plurality of joints buckled in sequence, and each of the joints including:
         a main portion having a first mating surface, an opposite second mating surface, an inner surface connected to an edge of the first mating surface and an edge of the second mating surface, and an outer surface connected to another edge of the first mating surface and another edge of the second mating surface, wherein a distance between the first mating surface and the second mating surface gradually increases in a direction from the inner surface to the outer surface, the main portion has an arced track groove recessed on the first mating surface, and a center of circle of the track groove is located at one side of the outer surface away from the second mating surface; and
         a buckling portion extended from the second mating surface, wherein in any two buckled joints, the buckling portion of one of the any two buckled joints is arranged in the track groove of the other joint, and the any two buckled joints are rotatable relative to each other between a first position and a second position;
      two fixing members respectively installed on two of the joints arranged at two opposite ends of the modular joint assembly; and
      a resilient sheet fixed on the outer surfaces of the joints and the two fixing members, wherein an imaginary datum line is defined by connecting the centers of the track grooves, the imaginary datum line is located at one side of the resilient sheet away from the modular joint assembly, and when the any two buckled joints are rotated with respect to each other, the resilient sheet is compressed and a length of the imaginary datum line is unchanged; and
   a bendable display mounted on the resilient sheet and arranged at the imaginary datum line, wherein the bendable display and the imaginary datum line are configured to bend synchronously,
   wherein each of the two fixing members has a third mating surface, one of the two fixing member has an arced auxiliary track groove recessed on the third mating surface thereof, and the other fixing member has an auxiliary buckling portion extended from the third mating surface thereof, wherein the buckling portion and the track groove arranged on the two opposite ends of the modular joint assembly are respectively coupled with the auxiliary track groove and the auxiliary buckling portion.

2. The display apparatus as claimed in claim 1, wherein when the any two buckled joints are arranged at the second position, the first mating surface of one of the any two buckled joints is stacked on the adjacent second mating surface of the other joint.

3. The display apparatus as claimed in claim 1, wherein the first mating surface and the second mating surface of each of the joints are planar surfaces and extend virtually to define an intersection line, wherein when the any two buckled joints are arranged at the first position, the two intersection lines are spacedly arranged on a plane, and when the any two buckled joints are arranged at the second position, the two intersection lines are overlapped with each other.

4. The display apparatus as claimed in claim 1, wherein when the any two buckled joints are arranged at the first position, the first mating surface and the adjacent second mating surface respectively arranged on the any two buckled joints have an angle equal to an angle defined by the first mating surface and the second mating surface of each of the joints.

5. The display apparatus as claimed in claim 1, wherein in each of the joints, the main portion has a stopping ridge arranged in the track groove and adjacent to the first mating surface, the buckling portion has a hook arranged on a free end thereof; wherein when the any two buckled joints are arranged at the first position, the hook of one of the any two buckled joints is abutted against the stopping ridge of the other joint.

6. The display apparatus as claimed in claim 1, wherein in each of the joints, the main portion has a guiding concavity formed on a common border between the first mating surface and the outer surface, a guiding protusion is extended from a common border between the second mating surface and the outer surface; wherein in the any two buckled joints, the guiding protrusion of one of the any two buckled joints is movable and abutted against the guiding concavity of the other joint.

7. The display apparatus as claimed in claim 1, wherein the resilient sheet includes a plurality of fixing portions and a plurality of stretchable portions, two opposite ends of each of the stretchable portions are connected to two of the fixing portions, and the fixing portions are fixed on the outer surfaces of the joints and the two fixing members.

8. A supporting device, comprising:
   a modular joint assembly having a plurality of joints buckled in sequence, and each of the joints including:
      a main portion having a first mating surface, an opposite second mating surface, an inner surface connected to an edge of the first mating surface and an edge of the second mating surface, and an outer surface connected to another edge of the first mating surface and another edge of the second mating surface, wherein a distance between the first mating surface and the second mating surface gradually increases in a direction from the inner surface to the outer surface, the main portion has an arced track groove recessed on the first mating surface, and a center of circle of the track groove is located at one side of the outer surface away from the second mating surface; and
      a buckling portion extended from the second mating surface, wherein in any two buckled joints, the buckling portion of one of the any two buckled joints is arranged in the track groove of the other joint, and the any two buckled joints are rotatable relative to each other between a first position and a second position;
   two fixing members respectively installed on two of the joints arranged at two opposite ends of the modular joint assembly; and
   a resilient sheet fixed on the outer surfaces of the joints and the two fixing members, wherein an imaginary datum line is defined by connecting the centers of the track grooves, the imaginary datum line is located at one side of the resilient sheet away from the modular joint assembly, and when the any two buckled joints are rotated with respect to each other, the resilient sheet is compressed and a length of the imaginary datum line is unchanged, wherein the resilient sheet includes a plurality of fixing portions and a plurality of stretchable portions, two opposite ends of each of the stretchable portions are connected to two of the fixing portions, and the fixing portions are fixed on the outer surfaces of the joints and the two fixing members.

9. The supporting device as claimed in claim 8, wherein when the any two buckled joints are arranged at the second position, the first mating surface of one of the any two buckled joints is stacked on the adjacent second mating surface of the other joint.

10. The supporting device as claimed in claim 8, wherein the first mating surface and the second mating surface of each of the joints are planar surfaces and extend virtually to define an intersection line, when the any two buckled joints are arranged at the first position, the two intersection lines are spacedly arranged at a plane, and when the any two buckled joints are arranged at the second position, the two intersection lines are overlapped with each other.

11. The supporting device as claimed in claim 10, wherein when the any two buckled joints are arranged at the first position, the first mating surface and the adjacent second mating surface respectively arranged on the any two buckled joints have an angle equal to an angle defined by the first mating surface and the second mating surface of each of the joints.

12. The supporting device as claimed in claim 8, wherein in each of the joints, the main portion has a stopping ridge arranged in the track groove and adjacent to the first mating surface, the buckling portion has a hook arranged on a free end thereof; wherein when the any two buckled joints are arranged at the first position, the hook of one of the any two buckled joints is abutted against the stopping ridge of the other joint.

13. The supporting device as claimed in claim 8, wherein in each of the joints, the main portion has a guiding concavity formed on a common border between the first mating surface and the outer surface, a guiding protrusion is extended from a common border between the second mating surface and the outer surface; wherein in the any two buckled joints, the guiding protrusion of one of the any two buckled joints is movable and abutted against the guiding concavity of the other joint.

14. The supporting device as claimed in claim 8, wherein each of the two fixing members has a third mating surface, one of the two fixing member has an arced auxiliary track groove recessed on the third mating surface thereof, and the other fixing member has an auxiliary buckling portion extended from the third mating surface thereof, wherein the buckling portion and the track groove arranged on the two opposite ends of the modular joint assembly are respectively coupled with the auxiliary track groove and the auxiliary buckling portion.

15. A supporting device, comprising:
a modular joint assembly having a plurality of joints buckled in sequence, and each of the joints including:
a main portion having a first mating surface, an opposite second mating surface, an inner surface connected to an edge of the first mating surface and an edge of the second mating surface, and an outer surface connected to another edge of the first mating surface and another edge of the second mating surface, wherein a distance between the first mating surface and the second mating surface gradually increases in a direction from the inner surface to the outer surface, the main portion has an arced track groove recessed on the first mating surface, and a center of circle of the track groove is located at one side of the outer surface away from the second mating surface; and
a buckling portion extended from the second mating surface, wherein in any two buckled joints, the buckling portion of one of the any two buckled joints is arranged in the track groove of the other joint, and the any two buckled joints are rotatable relative to each other between a first position and a second position;
two fixing members respectively installed on two of the joints arranged at two opposite ends of the modular joint assembly; and
a resilient sheet fixed on the outer surfaces of the joints and the two fixing members, wherein an imaginary datum line is defined by connecting the centers of the track grooves, the imaginary datum line is located at one side of the resilient sheet away from the modular joint assembly, and when the any two buckled joints are rotated with respect to each other, the resilient sheet is compressed and a length of the imaginary datum line is unchanged,
wherein in each of the joints, the main portion has a guiding concavity formed on a common border between the first mating surface and the outer surface, a guiding protrusion is extended from a common border between the second mating surface and the outer surface;
wherein in the any two buckled joints, the guiding protrusion of one of the any two buckled joints is movable and abutted against the guiding concavity of the other joint.

* * * * *